(12) United States Patent  
Suh et al.

(10) Patent No.: US 8,692,310 B2  
(45) Date of Patent: Apr. 8, 2014

(54) GATE FRINGING EFFECT BASED CHANNEL FORMATION FOR SEMICONDUCTOR DEVICE

(75) Inventors: YouSeok Suh, Cupertino, CA (US);  
Sung-Yong Chung, Davis, CA (US);  
Ya-Fen Lin, Saratoga, CA (US);  
Yi-Ching Wu, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/368,023

(22) Filed: Feb. 9, 2009

(65) Prior Publication Data  
US 2010/0200904 A1 Aug. 12, 2010

(51) Int. Cl.  
*H01L 29/792* (2006.01)

(52) U.S. Cl.  
USPC ..... 257/324; 257/315; 257/321; 257/E21.681

(58) Field of Classification Search  
USPC ............................ 257/315, 321, 324, E21.681  
See application file for complete search history.

(56) References Cited

U.S. PATENT DOCUMENTS

| | | | | |
|---|---|---|---|---|
| 5,677,556 A * | 10/1997 | Endoh | ........................... | 257/316 |
| 7,675,779 B2 * | 3/2010 | Kim et al. | ................. | 365/185.17 |
| 7,696,552 B2 * | 4/2010 | Youn et al. | ..................... | 257/296 |
| 2006/0138563 A1 * | 6/2006 | Park et al. | ...................... | 257/390 |
| 2007/0205445 A1 * | 9/2007 | Park et al. | ...................... | 257/288 |
| 2008/0318381 A1 * | 12/2008 | Matamis et al. | ............... | 438/264 |
| 2009/0103371 A1 * | 4/2009 | Goda et al. | ............... | 365/185.29 |

* cited by examiner

*Primary Examiner* — Tan N Tran

(57) ABSTRACT

Methods and structures for forming semiconductor channels based on gate fringing effect are disclosed. In one embodiment, a NAND flash memory device comprises multiple NAND strings of memory transistors. Each memory transistor includes a charge trapping layer and a gate electrode formed on the charge trapping layer. The memory transistors are formed close to each other to form a channel between an adjacent pair of the memory transistors based on a gate fringing effect associated with the adjacent pair of the memory transistors.

14 Claims, 5 Drawing Sheets

GATE FRINGING EFFECT BASED CHANNEL FORMATION FOR SEMICONDUCTOR DEVICE

FIELD OF TECHNOLOGY

This disclosure relates generally to technical fields of semiconductor manufacturing.

BACKGROUND

A conventional NAND flash memory device 100 includes multiple NAND strings of memory transistors. FIG. 1 illustrates two NAND strings of the conventional NAND flash memory device 100. To program a memory transistor 102, a selected bitline 1 is grounded by passing a bitline select voltage 104 of 0 volt through the drain of a drain select (DS) transistor 1 to a node of the memory transistor 102, while a bitline 2 and the rest of the bitlines are self boosted by coupling to a programming voltage 118 and/or a pass voltage 120 to inhibit the programming. A drain select (DS) line 108 and a source select (SS) line 110 are coupled to a node of a DS voltage 112 and to a node of a SS voltage 114, respectively. The supply voltage of the DS line 108 turns on the DS transistor 1 and maintains the connection of the bitline 1 to the bitline select voltage 104, but it turns off the DS transistor 2, thus disconnecting the bitline 2 from the bitline unselect voltage 106. The SS voltage 114 coupled to the SS line 110 turns off both the SS transistor 1 and the SS transistor 2, thus isolating the two bitlines from a node of a common source voltage 116 during the programming.

Furthermore, a wordline N coupled to the control gate of the memory transistor 102 is applied by the programming voltage 118 of 18 volts while the unselected wordlines are applied by the pass voltage 120 of 11 volts. Since the channel of the bitline 1 is coupled to the bitline select voltage 104 of 0 volt, it is maintained at the channel voltage of 0 volt, whereas the channel potential of the bitline 2 is coupled up by the programming voltage 118 and/or the pass voltage 120. For example, with the pass voltage 120 of 11 volts being supplied to the unselected wordlines, the channel voltage of the bitline 2 may range between 6 to 9 volts.

Before the programming takes place, the threshold voltage of the cell 102 is about −2 volt. When the programming voltage 118 is applied, the high voltage of the programming voltage 118 causes the tunneling of electrons from the silicon substrate of the memory transistor 102 to the charge trap layer of the memory transistor 102, thus increasing the threshold voltage to a positive voltage of 1 volt, whereas the voltage differential between the silicon substrate and the floating gate of each unselected cell is not large enough to cause the change in the threshold voltage of its respective transistor.

FIG. 2 illustrates an exploded view of a portion of the bitline 2 viewed across Y-direction which includes the SS transistor 2, a memory transistor 122 (e.g., coupled to an edge wordline, such as the wordline N), and a memory transistor 124. The SS transistor 2 controls the bitline 2 for connecting to a common source 202. Furthermore, the SS transistor 2 is 200 nm in size, the transistors 90 nm in size, and the channels 100 nm in size. The boosted junction potential between the SS transistor 2 and the memory transistor 122 may range between 6 and 9 volts, where the gate of the SS transistor 2 is grounded. Provided that the channel voltage for unselected bitline 2 being 6 to 9 volts, the gate voltage of the memory transistor 122 being 18 volts, and the gate voltage of the SS transistor 2 being 0 volt, there is a great disturbance with the band-to-band tunneling of the memory transistor 122. That is, the memory transistor 122 is disturbed by an electron hole pair (EHP) generation due to a gate induced drain junction leakage (GDIL) current.

The GIDL current arises in a high electric field under a gate-junction overlap region and a low gate to drain bias. The GIDL current occurs when current flows from the junction 204 in direction to the substrate 208 under the gate-junction overlap region, such as the overlap region of the gate of the SS transistor 2 and the junction 204. The GIDL is due to the formation of the depletion region and the region's high electric field in presence of the low or negative bias in the gate of the SS transistor 2 (e.g., 0 volt), and the positive bias in the junction 204 of the cell 122 (e.g., 6 to 9 volts). In the overlap gate-junction region, the high electric field creates electron-hole pairs (EHPs) where electrons through the barrier height are collected by the junction 204, and the holes (e.g., a hole 210) are collected by the substrate 208. When the electrons (e.g., an electron 212) generated due to the GIDL jump on a charge trapping layer 214 of the memory transistor 122, the electrons may program the memory transistor 122, which is not selected for programming, thus resulting in a programming error.

As the chip size gets smaller, the smaller channel length may create a short channel effect where the drain voltage of each transistor in the chip has more effect on the drain current than the gate to source voltage has. Accordingly, the short channel effect may contribute to the occurrence of the programming error due to the GIDL, which is another obstacle to the industry's effort for scaling down the chip size.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

An embodiment described in the detailed description is directed to a NAND flash memory device which comprises multiple NAND strings of memory transistors, with each one of the memory transistors including a charge trapping layer and a gate electrode formed on the charge trapping layer, where the memory transistors are formed close to each other to form a channel between an adjacent pair of the memory transistors based on a gate fringing effect associated with the adjacent pair of the memory transistors.

Another embodiment described in the detailed description is directed to a method for forming a NAND string of memory transistors which comprises forming multiple charge trapping layers on a semiconductor substrate, and forming respective gate electrodes on the charge trapping layers, where the memory transistors are formed close to each other to form a channel between an adjacent pair of the memory transistors based on a gate fringing effect associated with the adjacent pair of the memory transistors.

As illustrated in the detailed description, other embodiments pertain to devices and methods that provide an improved fabrication process of a NAND flash memory device, and in particular, an omission of drain and source region formation from the conventional methods of fabricating the NAND flash memory device. By forming memory transistors of the NAND flash memory device sufficiently close to each other, the channels between adjacent pairs of the memory transistors can be formed based on gate fringing effects of their gate electrodes. As a result, the fabrication process of the NAND flash memory device can be simplified significantly. In addition, since there is neither source nor drain region formed in the NAND flash memory device, the programming error due to the GIDL current can be eliminated. Furthermore, since there is no need to worry about the short channel effect with the elimination of the junction region in the device, the NAND flash memory device can be further scaled down.

BRIEF DESCRIPTION OF THE DRAWINGS

Example embodiments are illustrated by way of example and not limitation in the figures of the accompanying drawings, in which like references indicate similar elements and in which.

Figure 1:
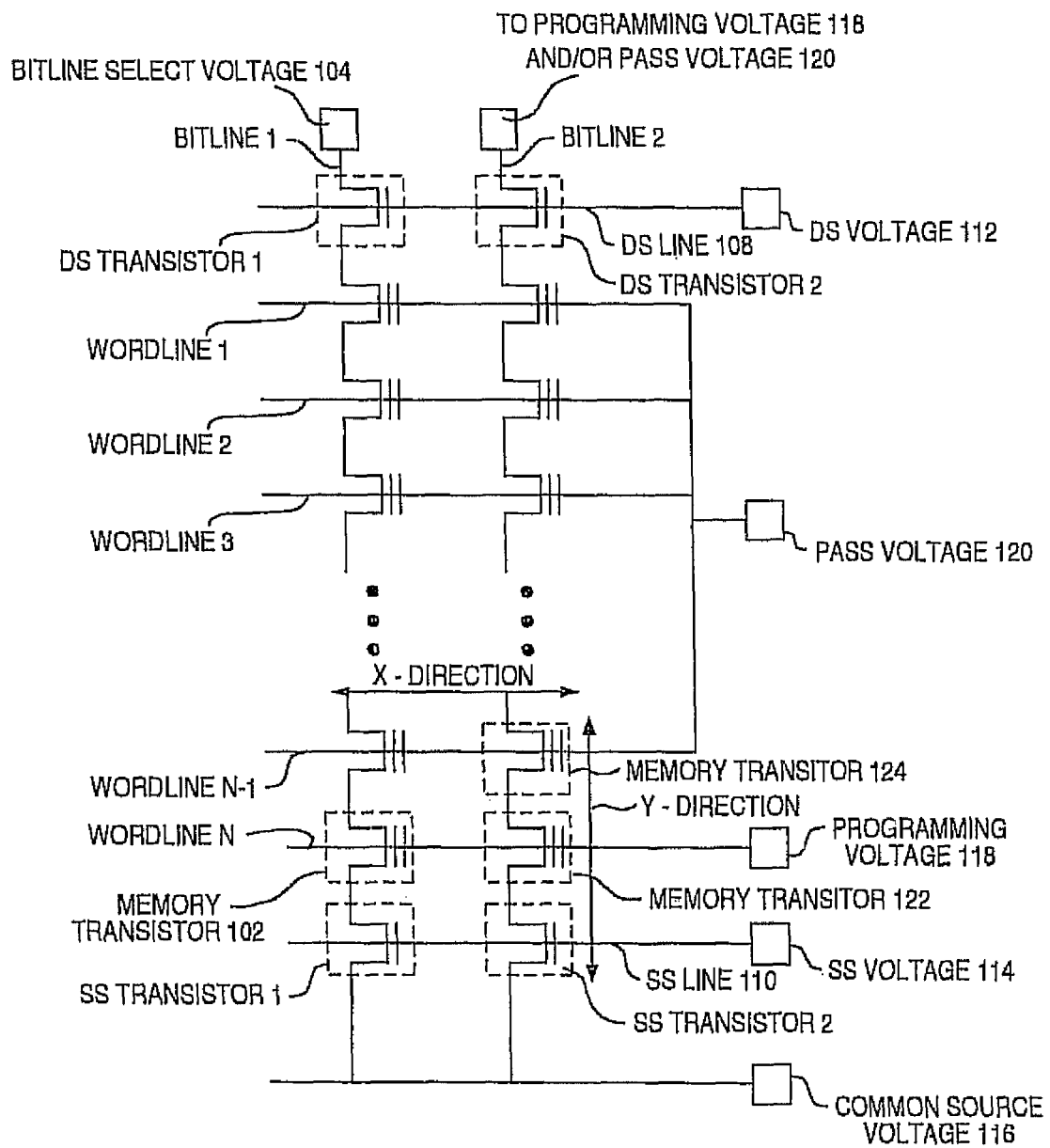
FIG. 1 illustrates two NAND strings of the conventional NAND flash memory device.
Figure 2:
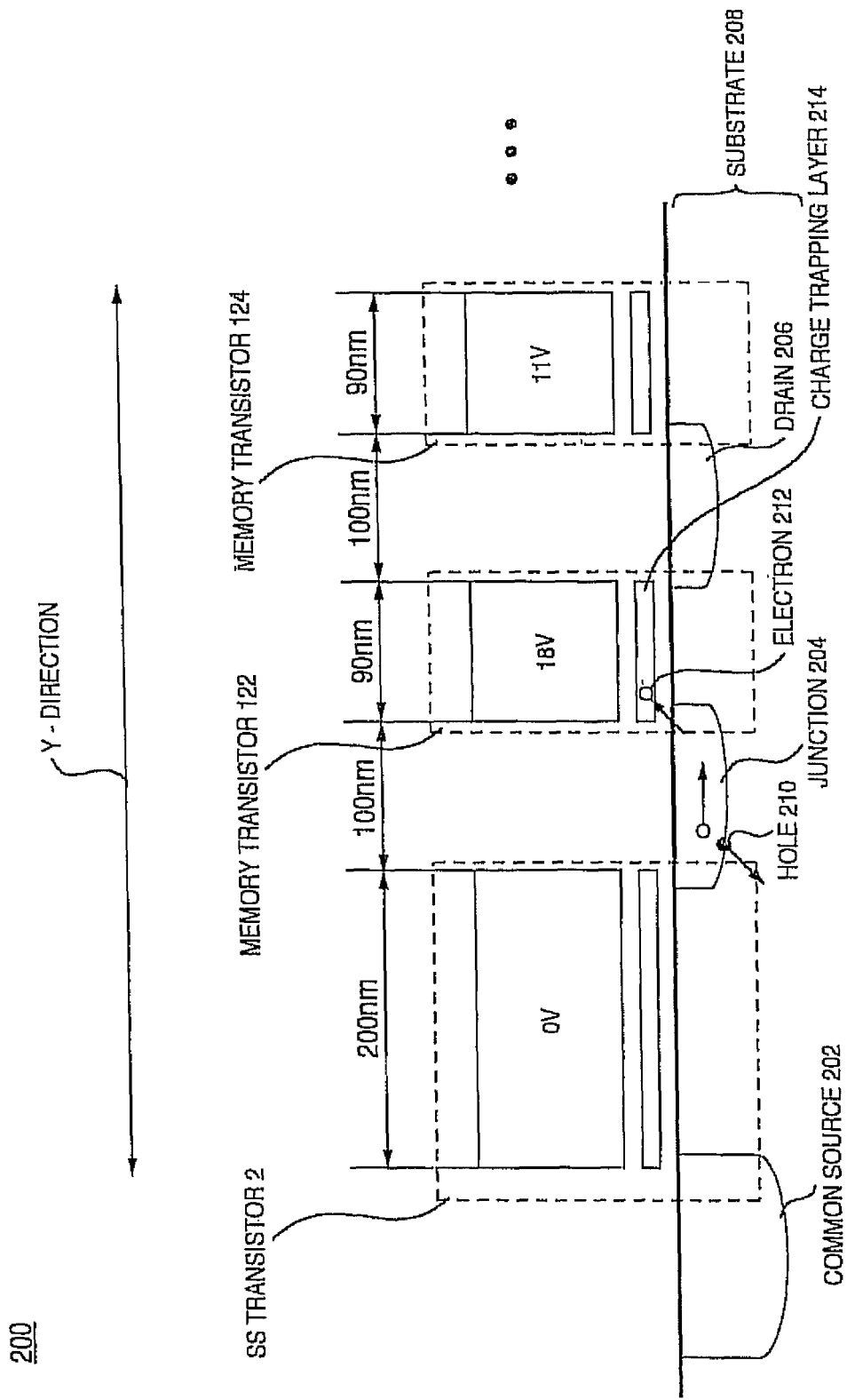
FIG. 2 illustrates an exploded view of a NAND string of the conventional NAND flash memory device of FIG. 1.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, other embodiments pertain to devices and methods that provide an improved fabrication process of a NAND flash memory device, and in particular, an omission of drain and source region formation from the conventional methods of fabricating the NAND flash memory device. By forming memory transistors of the NAND flash memory device sufficiently close to each other, the channels between adjacent ones of the memory transistors can be formed based on gate fringing effects of their gate electrodes. As a result, the fabrication process of the NAND flash memory device can be simplified significantly. In addition, since there is neither a source nor a drain region formed in the NAND flash memory device, the programming error due to the GIDL current can be eliminated. Furthermore, since there is no need to worry about the short channel effect with the elimination of the junction region in the device, the NAND flash memory device can be further scaled down.

Figure 3:
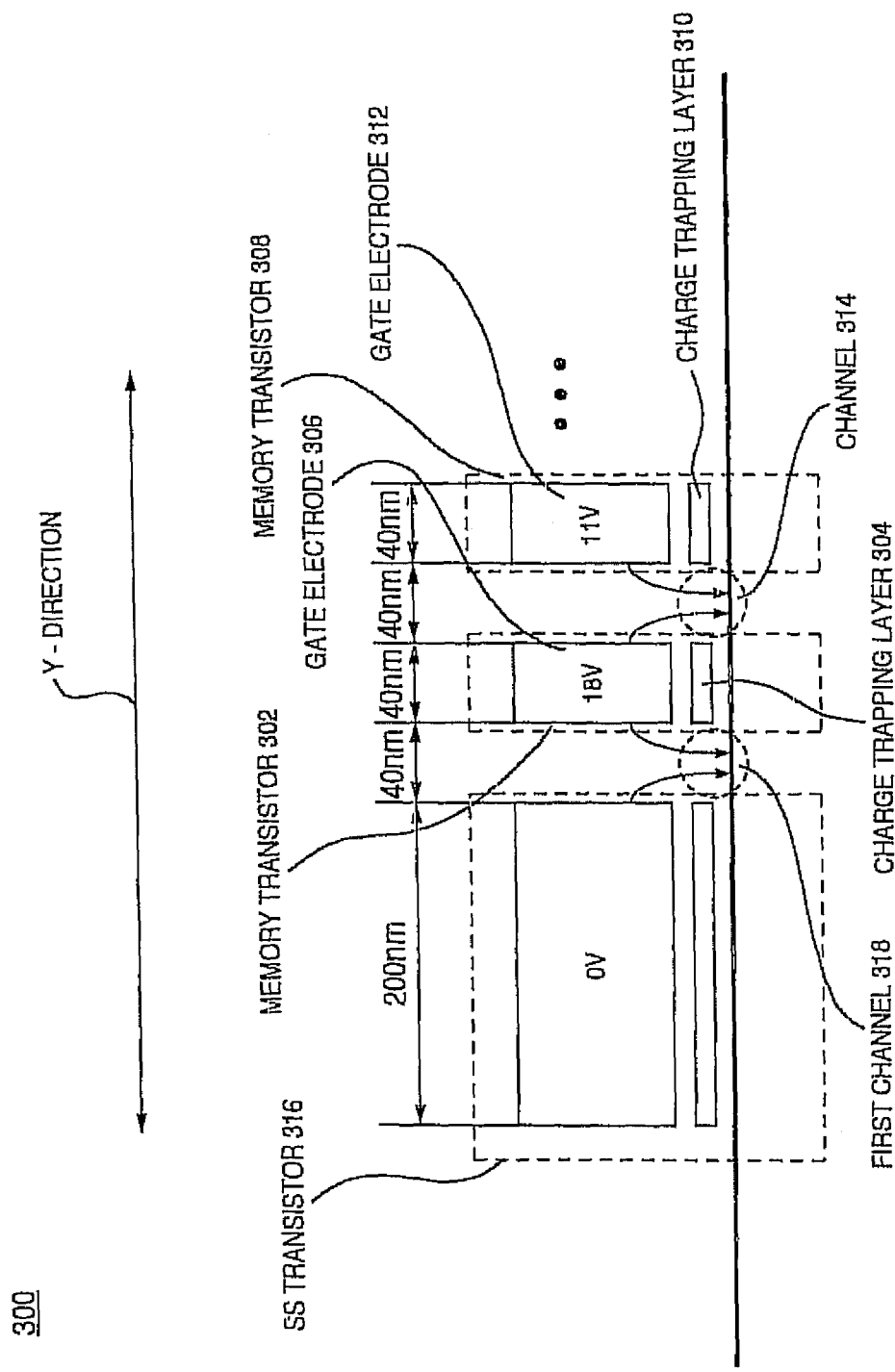
FIG. 3 illustrates an exploded view of a NAND string of an exemplary NAND flash memory device, according to one embodiment.

FIG. 3 illustrates an exploded view of a NAND string of an exemplary NAND flash memory device, according to one embodiment. The NAND flash memory device includes multiple NAND strings (e.g., bitlines) of memory transistors, and each memory transistor (e.g., a memory transistor 302, a memory transistor 308, etc.) includes a charge trapping layer (e.g., a charge trapping layer 304, a charge trapping layer 310, etc.) and a gate electrode (e.g., a gate electrode 306, a gate electrode 312, etc.) formed on the charge trapping layer. In one embodiment, the memory transistors (e.g., a memory transistor 302, a memory transistor 308, etc.) are formed close to each other such that a channel (e.g., a channel 314) is formed between an adjacent pair of the memory transistors based on a gate fringing effect associated with the adjacent pair of the memory transistors. It is appreciated that the gate fringing effect is an electric field leakage through a periphery of the gate electrode (e.g., the gate electrode 306, the gate electrode 312, etc.) of each memory transistor. This effect becomes greater as the size of the NAND flash memory device becomes smaller.

Therefore, since the NAND flash memory device can form the channel between the adjacent memory transistors using the gate fringing effect, there is no need to form a source or a drain. In FIG. 3, the memory transistors are separated from each other by approximately 40 nanometers. In an alternative embodiment, the memory transistors can be separated from each other by less than 40 nanometers. As a result, the NAND flash memory device can be scaled down significantly without affecting its operation.

Similar to the NAND flash memory device 100 of FIG. 1, a source select line is coupled to each one of the multiple NAND strings of memory transistors, where the source select line comprises a source select transistor (e.g., a SS transistor 316) with a select gate at each intersection of the multiple NAND strings and the source select line. In addition, the source select transistor 316 and an adjacent memory transistor (e.g., the memory transistor 302) are formed close to each other such that a first channel 318 is formed between the source select transistor 316 and the adjacent memory transistor based on gate fringing effect associated with the source select transistor 316 and the adjacent memory transistor. The source select transistor 316 and the adjacent memory transistor are separated by approximately 40 nanometers or less.

It is appreciated that since there is neither source nor drain formed in the semiconductor substrate of the NAND flash memory device as illustrated in FIG. 3, there is no overlap region of the gate of the SS transistor 316 and the junction. Thus, no GIDL current is generated in the vicinity of the SS transistor 316. Therefore, there is no disturbance due to an electron hole pair (EHP) generation since there is no GDIL current. Accordingly, the occurrence of a programming error to the adjacent memory transistor (e.g., the memory transistor 302) can be eliminated since there is no EHP generation which causes the phenomenon.

Figure 4A:
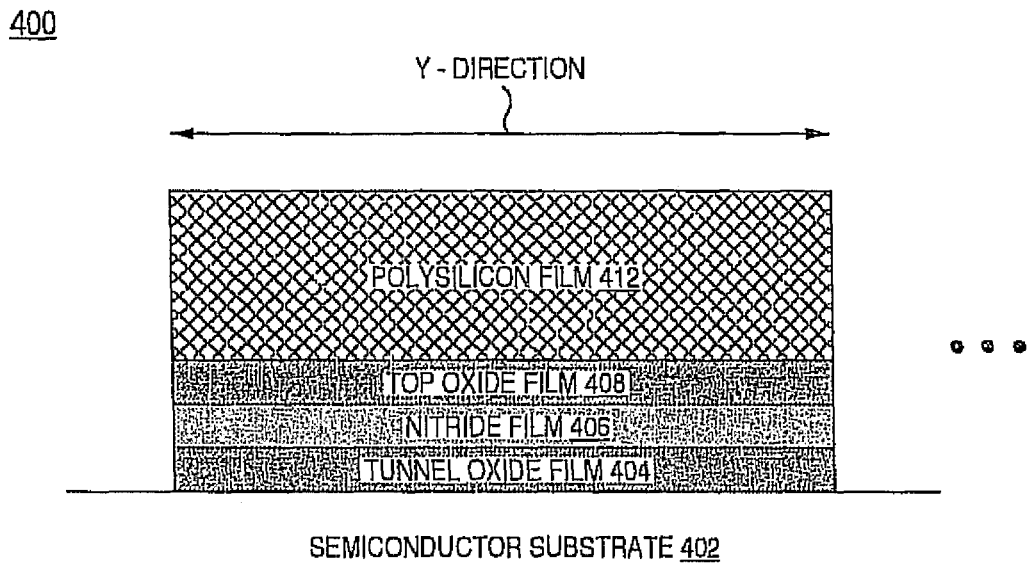
FIGS. 4(A) and 4(B) illustrate process steps for fabricating the NAND string of FIG. 3, according to one embodiment.
Figure 4B:
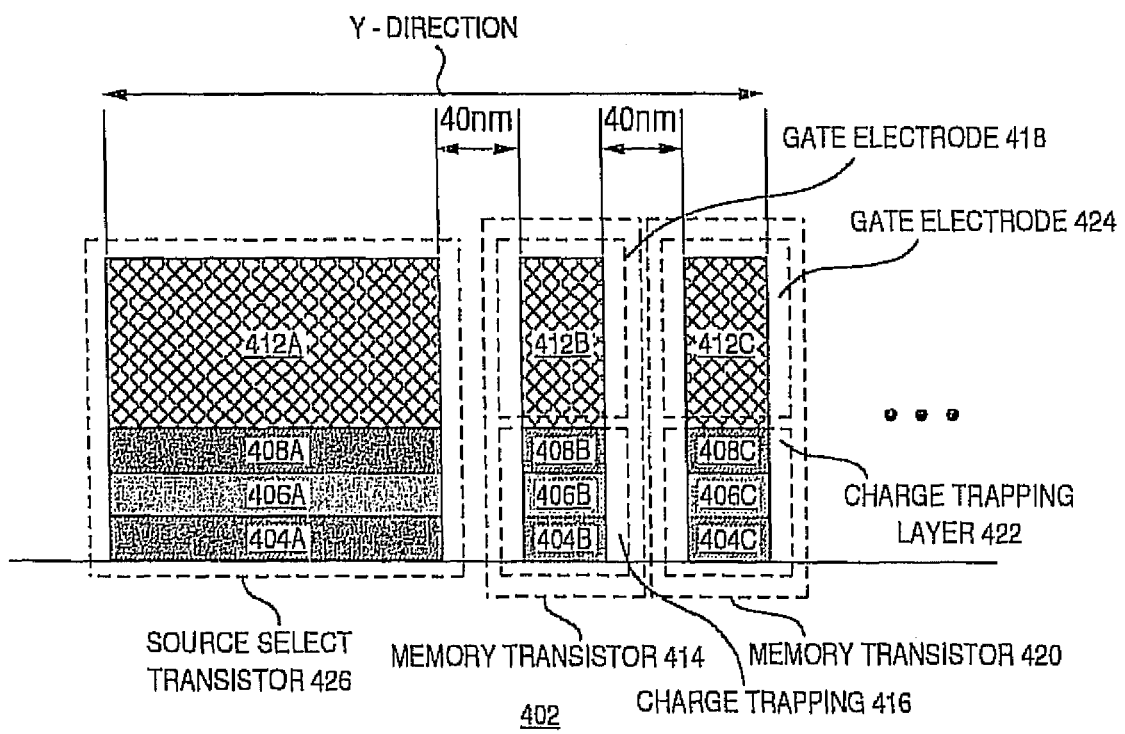

FIGS. 4(A) and 4(B) illustrate process steps for fabricating the NAND string of FIG. 3, according to one embodiment. In FIG. 4(A), a tunneling layer such as a tunnel oxide film 404 is formed on a semiconductor substrate 402. Next, a charge trap layer such as nitride film 406 is formed on the tunnel oxide film 404. Then, a top blocking layer such as a top oxide film 408 is formed on the nitride film 406. For example, the tunnel oxide film 404, the nitride film 406, and the top oxide film 408 form a charge trapping layer or a floating gate of a NAND flash memory device. Furthermore, a polysilicon film 412 or metal film is formed on the top oxide film 408 as a gate electrode.

FIG. 4(B) illustrates memory transistors (e.g., a memory transistor 414, a memory transistor 420, etc.) and a source select transistor 426 formed on the NAND string. It is appreciated that the memory transistors and the source select transistors 426 may be formed by a variety of masking and/or etching techniques. Each memory transistor includes a charge trapping layer (e.g., a charge trapping layer 416, a charge trapping layer 422, etc.) and a gate electrode (e.g., a gate electrode 418, a gate electrode 424, etc.) formed on the charge trapping layer. In one embodiment, the memory transistors comprise neither a source nor a drain since a channel between the memory transistors can be formed based on a gate fringing effect associated with the memory transistors. In order to form the channel based on the gate fringing effect, the memory transistors need to be sufficiently close to each other. In one exemplary implementation, the memory transistors are separated by approximately 40 nanometers. In another exemplary implementation, the adjacent ones of the memory transistors are separated by less than 40 nanometers. It is appreciated that the fabrication process illustrated in FIGS. 4(A) and 4(B) is significantly simpler than the conventional fabrication techniques since steps for forming diffusion regions serving as a source region and/or a drain region, such as implanting impurities in the semiconductor substrate, can be eliminated.

In one embodiment, similar to FIG. 1, the source select transistor 426 having a select gate is formed next to a memory transistor (e.g., the memory transistor 414). In addition, the source select transistor 426 and the memory transistor are formed close to each other such that a first channel is formed between the source select transistor 426 and the adjacent memory transistor based on a gate fringing effect associated with the source select transistor 426 and the adjacent memory transistor. In one exemplary implementation, the source select transistor 426 and the adjacent memory transistor are separated by approximately 40 nanometers. In another exemplary implementation, the source select transistor 426 and the adjacent memory transistor are separated by less than 40 nanometers. It is appreciated the space between the source select transistor 426 and the adjacent memory transistor may be same as the space between the adjacent pair of the memory transistors (e.g., the memory transistor 414, the memory transistor 420, etc.) to simplify the fabrication process of the NAND flash memory device.

Figure 5:
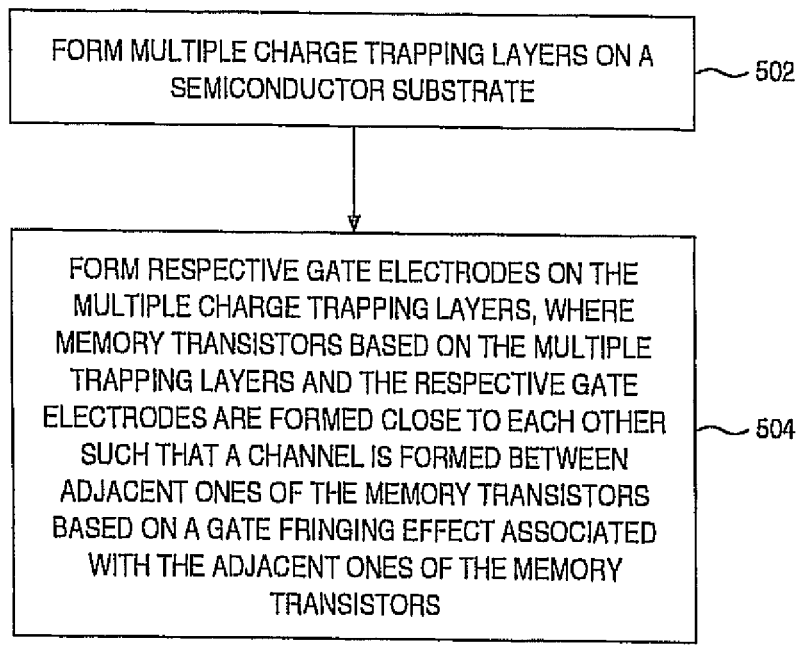
FIG. 5 is a process flow chart for forming a NAND string of an exemplary NAND flash memory device, according to one embodiment.

FIG. 5 is a process flow chart for forming a NAND string of an exemplary NAND flash memory device, according to one embodiment. In operation 502, multiple charge trapping layers are formed on a semiconductor substrate. In operation 504, respective gate electrodes are formed on the charge trapping layers, where the memory transistors are formed close to each other such that a channel is formed between an adjacent pair of the memory transistors based on a gate fringing effect associated with the adjacent pair of the memory transistors. In addition, a select line coupled to the NAND string of memory transistors is formed, where the source select line comprises a source select transistor with a select gate at an intersection of the NAND string of memory transistors and the source select line.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for forming a NAND string of memory transistors, comprising:
   forming a plurality of charge trapping layers on a semiconductor substrate; and
   forming respective gate electrodes on the plurality of charge trapping layers, wherein the memory transistors are formed close to each other to form a channel between an adjacent pair of the memory transistors, wherein the channel is formed using a gate fringing effect associated with each memory transistor of the adjacent pair of memory transistors, wherein a source select transistor and its neighboring memory transistor are formed close to each other such that a first channel is formed between the source select transistor and the neighboring memory transistor based on a gate fringing effect associated with the source select transistor and the neighboring memory transistor, wherein the first channel serves as source and drain regions, and wherein a width between the adjacent pair of memory transistors and a width between the neighboring memory transistor and the source select transistor are equal.

2. The method of claim 1, wherein the memory transistors comprise neither a source nor a drain junction.

3. The method of claim 1, wherein the adjacent pair of the memory transistors are separated by approximately 40 nanometers.

4. The method of claim 1, wherein the adjacent pair of the memory transistors are separated by less than 40 nanometers.

5. The method of claim 1, further comprising forming a select line coupled to the NAND string of memory transistors, wherein a source select line includes a source select transistor with a select gate at an intersection of the NAND string of memory transistors and the source select line.

6. The method of claim 5, wherein the source select transistor and the neighboring memory transistor are separated by approximately 40 nanometers.

7. The method of claim 5, wherein the source select transistor and the neighboring memory transistor are separated by less than 40 nanometers.

8. A method for forming a string of memory transistors, comprising:
   forming a plurality of charge trapping layers on a semiconductor substrate;
   forming respective gate electrodes on the plurality of charge trapping layers,
   forming a plurality of channels on the semiconductor substrate, wherein each channel is formed using a gate fringing effect associated with each memory transistor of an adjacent pair of memory transistors, wherein a first channel of the plurality of channels is formed between a first adjacent pair of memory transistors and a second channel of the plurality of channels is formed between a second adjacent pair of memory transistors, wherein the first adjacent pair of memory transistors comprises first and second memory transistors and the second adjacent pair of memory transistors comprises the second memory transistor and a third memory transistor, and wherein a source select transistor and its neighboring memory transistor are formed close to each other such that a channel is formed between the source select transistor and the neighboring memory transistor based on a gate fringing effect associated with the source select transistor and the neighboring memory transistor, wherein the plurality of channels serve as source and drain regions, and wherein a width between the adjacent pairs of memory transistors and a width between the neighboring memory transistor and the source select transistor are equal.

9. The method of claim 8, wherein the memory transistors comprise neither a source nor a drain junction.

10. The method of claim 8, wherein the adjacent pair of the memory transistors are separated by approximately 40 nanometers.

11. The method of claim 8, wherein the adjacent pair of the memory transistors are separated by less than 40 nanometers.

12. The method of claim 8, further comprising forming a select line coupled to the string of memory transistors, wherein a source select line includes a source select transistor with a select gate at an intersection of the string of memory transistors and the source select line.

13. The method of claim 12, wherein the source select transistor and the neighboring memory transistor are separated by approximately 40 nanometers.

14. The method of claim 12, wherein the source select transistor and the neighboring memory transistor are separated by less than 40 nanometers.

* * * * *